(12) United States Patent
Allibert

(10) Patent No.: US 10,847,370 B2
(45) Date of Patent: Nov. 24, 2020

(54) METHOD FOR DISSOLVING A BURIED OXIDE IN A SILICON-ON-INSULATOR WAFER

(71) Applicant: Soitec, Bernin (FR)

(72) Inventor: Frederic Allibert, Albany, NY (US)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 16/342,133

(22) PCT Filed: Sep. 29, 2017

(86) PCT No.: PCT/EP2017/074823
§ 371 (c)(1),
(2) Date: Apr. 15, 2019

(87) PCT Pub. No.: WO2018/069067
PCT Pub. Date: Apr. 19, 2018

(65) Prior Publication Data
US 2019/0259617 A1 Aug. 22, 2019

(30) Foreign Application Priority Data
Oct. 13, 2016 (FR) ...................... 16 59917

(51) Int. Cl.
*H01L 21/3105* (2006.01)
*H01L 21/225* (2006.01)
*H01L 21/762* (2006.01)

(52) U.S. Cl.
CPC ...... *H01L 21/2254* (2013.01); *H01L 21/2255* (2013.01); *H01L 21/3105* (2013.01); *H01L 21/76254* (2013.01)

(58) Field of Classification Search
CPC .......... H01L 21/3105; H01L 21/76254; H01L 21/7624; H01L 21/2254
USPC ........................................................ 438/795
See application file for complete search history.

(56) References Cited

U.S. PATENT DOCUMENTS

| 2010/0244206 A1 | 9/2010 | Bu et al. |
| 2013/0093039 A1 | 4/2013 | Leobandung et al. |
| 2016/0056052 A1* | 2/2016 | Landru ............... H01L 21/7624 438/477 |

(Continued)

FOREIGN PATENT DOCUMENTS

| CN | 105051881 A | 11/2015 |
| FR | 2937794 A1 | 4/2010 |
| JP | 2007-180416 A | 7/2007 |

(Continued)

OTHER PUBLICATIONS

Taiwanese Search Report and Office Action from Taiwanese Application No. 10720233430, dated Mar. 16, 2018, 03 pages.

(Continued)

*Primary Examiner* — Jami Valentine Miller
(74) *Attorney, Agent, or Firm* — Traskbritt

(57) ABSTRACT

A method for dissolving a buried oxide in a silicon-on-insulator wafer comprises providing a silicon-on-insulator wafer having a silicon layer attached to a carrier substrate via a buried oxide layer, and annealing the silicon-on-insulator wafer to at least partially dissolve the buried oxide layer. The method further comprises a step of providing an oxygen scavenging layer on or over the silicon layer before the annealing step.

20 Claims, 6 Drawing Sheets

(56) References Cited

U.S. PATENT DOCUMENTS

2017/0062236 A1* 3/2017 Landru ............... H01L 21/7624

FOREIGN PATENT DOCUMENTS

| KR | 10-2015-0135368 A | 12/2015 |
|----|-------------------|---------|
| KR | 10-2017-0036337 A | 4/2017 |
| TW | 200404371 A | 3/2004 |
| TW | 201019396 | 5/2010 |
| TW | 201034076 | 9/2010 |
| WO | 20141155166 A1 | 10/2014 |

OTHER PUBLICATIONS

Preliminary Search Report and Written Opinion received for French Application No. 1659917, dated Jun. 15, 2017, 07 pages.
International Written Opinion for International Application No. PCT/EP2017/074823, dated Jan. 11, 2018, 05 pages.
International Search Report for International Application No. PCT/EP2017/074823, dated Jan. 11, 2018, 03 pages.
Ando et al, "Ultimate Scaling of High-k Gate Dielectrics: Current Status and Challenges," International Conference on Solid State Devices and Materials, Kyoto, 2012, pp. 717-718.

* cited by examiner

US 10,847,370 B2

METHOD FOR DISSOLVING A BURIED OXIDE IN A SILICON-ON-INSULATOR WAFER

CROSS-REFERENCE TO RELATED APPLICATIONS

This application is a national phase entry under 35 U.S.C. § 371 of International Patent Application PCT/EP2017/074823, filed Sep. 29, 2017, designating the United States of America and published as International Patent Publication WO 2018/069067 A1 on Apr. 19, 2018, which claims the benefit under Article 8 of the Patent Cooperation Treaty to French Patent Application Serial No. 1659917, filed Oct. 13, 2016.

TECHNICAL FIELD

The present disclosure relates to a buried oxide dissolution method by annealing a silicon-on-insulator (SOI) wafer.

BACKGROUND

In order to bring several improvements to silicon-on-insulation (SOI) wafers with an ultrathin buried oxide (BOX) layer, that is a BOX layer having a thickness of about 50 nm or less, in particular, for enabling bonding using a thicker oxide than the final target (for defect reduction), and for improving the BOX electrical reliability, it is known to submit SOI wafers to a BOX dissolution annealing step.

Typically, the presence of oxygen above a certain threshold in the ambient atmosphere is known to prevent the dissolution process from taking place. Thus, in known BOX dissolution methods, it is necessary to use an oxygen-tight furnace to ensure a low partial pressure of oxygen in the annealing ambient atmosphere.

In addition, if the SOI wafer has a thin silicon layer, for instance a silicon layer having a thickness of about 150 nm or less, during the high temperature anneal, the so-called de-wetting or silicon ball-up phenomenon is known to take place, whereby the wafer becomes no longer usable. As a consequence, in known BOX dissolution methods, it is necessary to provide a SOI wafer having a thick silicon layer, typically with a thickness of about 200 nm, on top of the BOX layer.

Moreover, known BOX dissolution methods are limited by the diffusion of oxygen from the BOX layer through the silicon layer, and by the removal of SiO from the vicinity of the SOI wafer surface, which are known to result in a non-uniformity of the final layer thicknesses. In particular, as disclosed in WO 2014/155166 A1, in known BOX dissolution methods, the residual oxygen content must be lower than 10 ppm. Furthermore, high temperatures (typically 1150° C. to 1200° C.) are needed for known BOX dissolution methods. In this respect, specific designs of the furnace with respect to temperature uniformity or adaptation of gas flow have been known to provide partial solutions, but this means that the kinetic of known BOX dissolution methods is dependent on specific furnace designs. In other words, standard furnaces, which are not oxygen-tight, cannot be used with known BOX dissolution methods.

Furthermore, the BOX dissolution reaction is generally known to be purely time-controlled, and the speed of the reaction is known to be temperature-dependent. As a consequence, the final dissolved thickness depends on the local temperature, which is known to result in additional non-uniformities.

In metal-oxide-semiconductor (CMOS) integrated technology, high permittivity or high dielectric constant (high-k) materials are typically used for the oxide gate dielectric in order to prevent leakage currents. Interfacial layer scavenging, i.e., depositing an oxygen scavenging layer directly on the oxide gate dielectric, is a known alternative to using even higher-k oxides ("*Ultimate Scaling of High-k Gate Dielectrics: Higher-k or Interfacial Layer Scavenging*" by T. Ando; Materials, 2012, Vol. 5, p. 478-500).

An example of interfacial layer scavenging can be found in US 2010/0244206 A1, which discloses a method of forming a high-k metal gate transistor (MOSFET) having interface nitridation to modulate threshold voltage and improve drive current. This document discloses a high-k dielectric gate structure comprising a substrate, a nitridized interfacial layer on the substrate, a high-k dielectric layer on the nitridized interfacial layer, and an oxygen scavenging layer on the high-k dielectric layer. In the method disclosed therein, an anneal is performed after depositing the oxygen scavenging layer on the high-k dielectric layer.

BRIEF SUMMARY

In view of the aforementioned problems, an objective of the present disclosure is to provide an improved BOX dissolution method, allowing, in particular, performance of the BOX dissolution annealing step also when the SOI wafer has a thin silicon layer, that is, when the silicon layer of the SOI wafer has a thickness below 150 nm or even less, and possibly without the need of an oxygen-tight furnace or of a specifically designed high-temperature furnace.

This objective is achieved with a method for dissolving a buried oxide in a silicon-on-insulator wafer, comprising a step of providing a silicon-on-insulator wafer having a silicon layer attached to a carrier substrate via a buried oxide layer, and subsequent step of annealing the silicon-on-insulation wafer to at least partially dissolve the buried oxide layer. According to the present disclosure, the method further comprises a step of providing an oxygen scavenging layer on or over the silicon layer before the annealing step.

Accordingly, the proposed inventive method is based on depositing an oxygen scavenging layer on top of the silicon layer of a SOI wafer before the BOX dissolution anneal. As mentioned above, interfacial layer scavenging is known in relation to metal-oxide-semiconductor technology in order to prevent leakage currents in high-k oxide gate dielectrics. More specifically, oxygen scavenging layers are only known to be deposited directly on an oxide layer such as the high-k oxide gate dielectric layer of a metal-oxide-semiconductor transistor. In other words, oxygen scavenging layers are only known for targeting gate oxides and are not known in combination with BOX dissolution methods. Surprisingly, it was found that using an oxygen scavenging layer with a SOI wafer, in particular, on or over the silicon layer of the SOI wafer, provides several beneficial advantages over known BOX dissolution methods:

The BOX dissolution method according to the present disclosure can be applied to SOI wafers comprising a silicon layer of any desired thickness. In particular, the present disclosure can advantageously be applied to SOI wafers having a thin silicon layer, i.e., a silicon layer with a thickness of about 150 nm or less, in particular, about 50 nm or less, more in particular, about 25 nm or less, or more in particular, even as thin as about 10 nm, because the capping oxygen scavenging layer will prevent the de-wetting or ball-up phenomenon from taking place. Thus, the inventive BOX dissolution method can even be used on materials which cannot be obtained in thick layers, such as strained silicon.

Furthermore, because the dissolution process is diffusion-limited, at the same temperature, the inventive BOX dissolution method can be performed up to 20 times faster on a SOI wafer having a silicon layer as thin as 10 nm than on a SOI wafer having a standard 200 nm thick silicon layer.

In addition, the inventive BOX dissolution method can also be performed at lower temperatures than know BOX dissolution methods, which in turn results in a significant simplification of the dissolution process with respect to known methods. In particular, the inventive BOX dissolution method allows using simpler furnace designs and does not require a high temperature furnace. Further advantageous features of the inventive BOX dissolution method include less sensitivity to slip-line generation and shorter ramp-up/down times.

Furthermore, the inventive BOX dissolution method can be limited by controlling the quantity of oxygen scavenging element in the oxygen scavenging layer. For instance, in some embodiments of the inventive BOX dissolution method, the oxygen scavenging layer can have a thickness adapted for dissolving at least a predetermined thickness of the buried oxide layer to be dissolved. In further preferred embodiments, the oxygen scavenging layer can comprise substoichiometric $HfO_2$, in other words $HfO_x$ with $x<2$, with a predetermined amount of Hf in excess of the $HfO_2$ stoichiometry. Depending on the desired application, the oxygen scavenging layer can be selected from at least one of: a lanthanide metal, a rare earth metal, a titanium rich (Ti-rich) titanium nitride (TiN), Group 2 elements, and Group 3 elements.

In any case, by controlling the quantity of oxygen scavenging element, the inventive BOX dissolution method advantageously becomes self-limited, i.e., when the corresponding amount of oxide is dissolved, the reaction stops. The thickness uniformity then depends on the oxygen scavenging layer deposition control and is independent of small variations in the temperature, anneal time, or gas flow in the furnace. In addition, this advantageously allows wafer-by-wafer tailoring of the BOX thickness. In other words, while the deposition thickness can be adapted wafer-by-wafer, several wafers can advantageously undergo the dissolution anneal together.

In some embodiments, the BOX dissolution method according to the present disclosure or any of its variants can further comprise, before the step of annealing, a step of providing a diffusion barrier layer on top of the oxygen scavenging layer and/or between the oxygen scavenging layer and the silicon layer. These variants are compatible and have the following advantages:

When the diffusion barrier layer is provided on top of the oxygen scavenging layer, in particular, directly on top of the oxygen scavenging layer, the diffusion barrier layer can be an oxygen diffusion barrier layer. This oxygen barrier layer can be, in particular, but not restricted thereto, a layer of a silicon nitride. Thus, this additional capping layer can advantageously prevent diffusion of oxygen from the ambient to the oxygen scavenging layer, whereby it becomes possible to use a furnace that is not oxygen-tight.

When the diffusion barrier layer is provided between the oxygen scavenging layer and the silicon layer, the diffusion barrier layer can be chosen so as to prevent diffusion of the oxygen scavenging element into the silicon layer. This diffusion barrier layer can be, in particular, but not restricted thereto, a layer of stoichiometric $HfO_2$ in the case where La or Hf is used as oxygen scavenging element. Advantageously, this additional layer can improve the control of the dissolution process, and/or prevent diffusion of the oxygen scavenging element into the silicon layer of the SOI wafer. It can also be used to simplify the deposition process.

A further advantage of the inventive BOX dissolution method is that an oxygen-controlled ambient is no longer strictly necessary. Indeed, a standard furnace, or at least a furnace that is not oxygen-tight, can be used, in particular, in combination with a very thick oxygen scavenging layer, so that the oxygen can still be scavenged from the BOX layer while being absorbed from the ambient at the same time. Alternatively, or in addition, this is also possible in combination with an optional additional layer on top of the oxygen scavenging layer, acting as diffusion barrier for the oxygen in the ambient, in which case the reaction can be self-limited, as explained above).

Finally, in the inventive BOX method, the step of providing the silicon-on-insulator wafer can comprise transferring the layer of silicon onto the carrier substrate using a layer transfer technique by ion implantation. Thus, SMART CUT® technology can be used, with all the underlying advantages, including the possible recycling of material from a donor silicon wafer and/or of a donor carrier substrate.

BRIEF DESCRIPTION OF THE DRAWINGS

The disclosure and its variants will be described in more detail in the following, based on advantageous embodiments described with reference to the accompanying figures, wherein.

Similar reference signs may be used to refer to the same features, or to analog or equivalent features thereof, throughout the embodiments and examples detailed hereafter and illustrated in the accompanying figures. Furthermore, the detailed description of features already described in previous embodiments may be omitted in subsequent embodiments for the sake of brevity. Unless explicitly mentioned, the accompanying figures are not meant to be representative of any dimensions or proportions.

DETAILED DESCRIPTION

Figure 6:
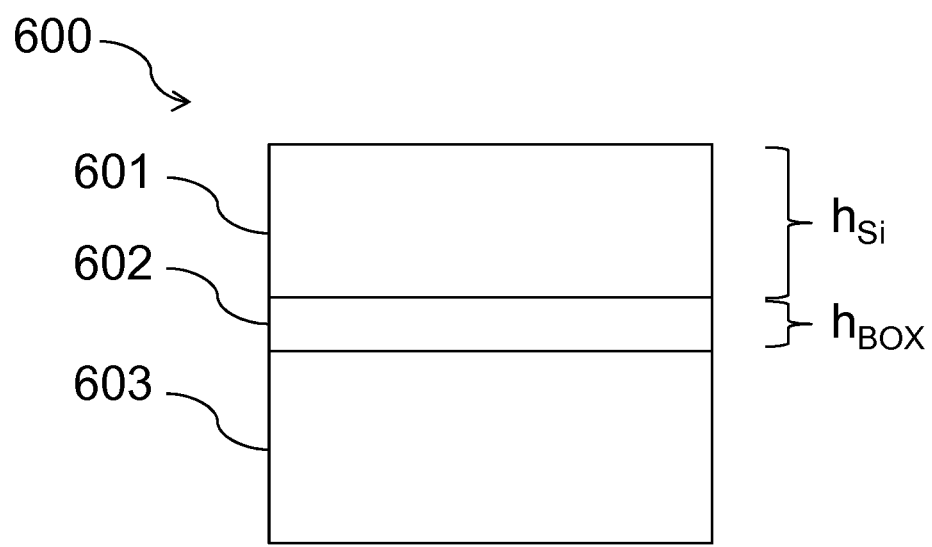
FIG. 6 schematically illustrates a typical silicon-on-insulator wafer used in a known buried oxide dissolution method.

FIG. 6, schematically representing an example of the known prior art, will first be described in the following. In a standard buried oxide (BOX) dissolution method, a silicon-on-insulator (SOI) wafer 600 is provided, as illustrated in FIG. 6. Typically, the SOI wafer 600 comprises a thick silicon (Si) layer 601 attached to a carrier substrate 603 by a buried oxide (BOX) layer 602. As commented above, in order to enable bonding using a thicker oxide than the final target for defect reduction and/or improving the electrical reliability of the buried oxide, the SOI wafer 600 undergoes a standard BOX dissolution anneal.

As also commented above, in standard methods, the BOX dissolution anneal requires both an oxygen-controlled ambient, i.e., an oxygen-tight furnace, and high temperatures, in particular, in a range from about 900° C. and up to about 1200° C. or more. Furthermore, in order to avoid the de-wetting or ball-up phenomenon, in standard methods, the silicon layer 601 must be sufficiently thick. Thus, in standard methods, the silicon layer 601 typically must have a thickness $hs_i$ of about 200 nm. In turn, the BOX layer 602 typically has a thickness $h_{BOX}$ of about 50 nm or less. Furthermore, the kinetic of standard BOX dissolution methods is defined by temperature and partial pressure of oxygen close to the wafer surface, and is dependent on the furnace design.

Exemplary embodiments of the disclosure will now be described, in particular, with reference to FIGS. 1-5.

A first exemplary embodiment of the disclosure will be described with reference to FIG. 1. According to the present disclosure, in a first step, a SOI wafer 100 is provided. The SOI wafer 100 comprises a silicon layer 101 attached to a carrier substrate 103 by a BOX layer 102. In a subsequent step, this SOI wafer 100 will undergo a BOX dissolution anneal. Without being restricted thereto, in the first embodiment, the step of providing the SOI wafer 100 can be achieved, for instance, using a layer transfer technology. In particular, a layer transfer technique by ion implantation such as the SMART CUT® technology may be used, with all the underlying advantages, including the possible recycling of material from a donor silicon wafer used for providing the transferred silicon layer 101 and/or recycling of a donor carrier substrate used for the carrier substrate 103.

Furthermore, according to the present disclosure, before the BOX dissolution anneal, the top silicon layer 101 of the SOI wafer 100 is capped by depositing thereon an oxygen scavenging layer 104. As will be explained hereafter, various advantages result from this additional step in comparison to known BOX dissolution methods.

In particular, by having the silicon layer 101 capped by the oxygen scavenging layer 104, no de-wetting will occur, such that is possible to use a silicon layer 101 having a thickness $hs_i$ well below that of the thick silicon layer 601 used in standard BOX dissolution methods. Thus, in the first embodiment, the silicon layer 101 can have a thickness s of about 150 nm or less, or even about 50 nm or less, for instance about 25 nm or less, and even as thin as about 10 nm.

Furthermore, the disclosure allows performing the BOX dissolution on thickness constrained films. Thus, in a variant of the first embodiment, the silicon layer 101 of the SOI wafer 100 can even be a strained silicon layer.

Figure 2:
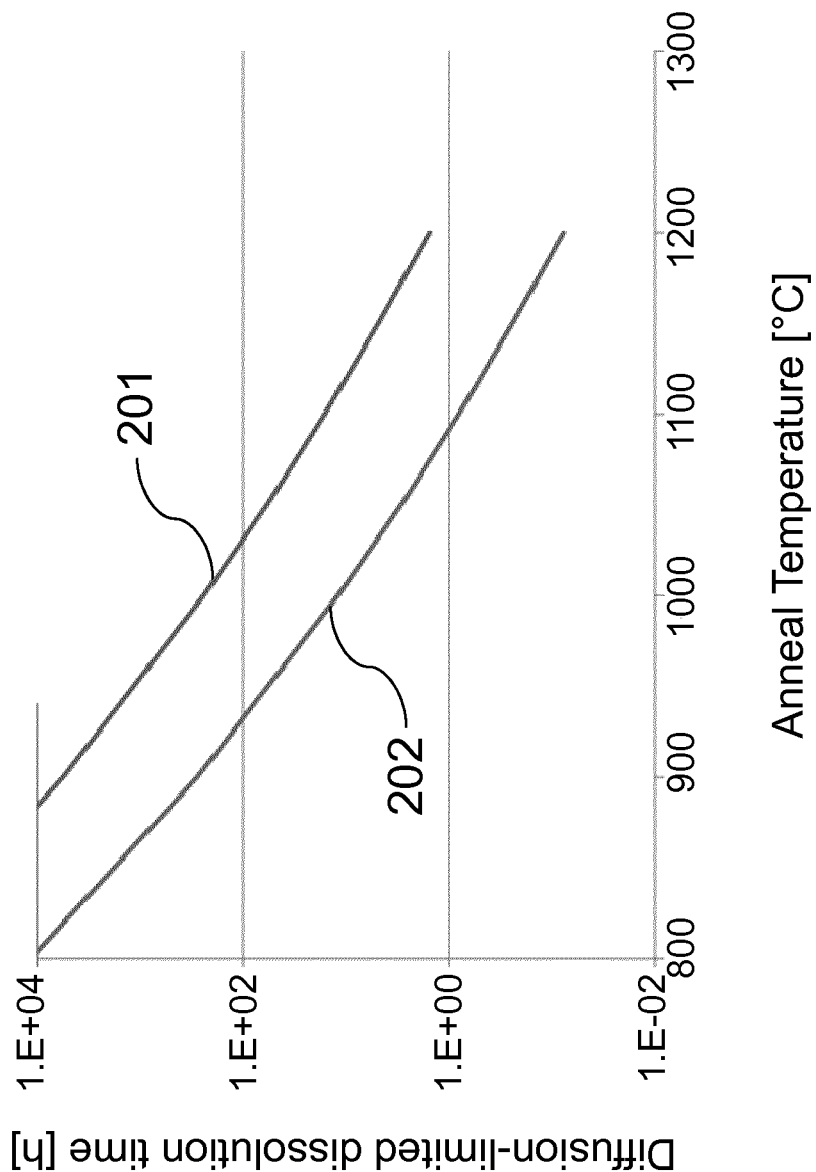
FIG. 2 is a plot representing exemplary diffusion-limited dissolution times obtained using the inventive method for a thin SOI films as a function of anneal temperature, in comparison with a standard method using a thick SOI film.

Further advantages of the disclosure will now be explained with reference to FIG. 2, representing diffusion-limited dissolution times, in hours, measured as a function of anneal temperature, in ° C.

A first line 201 represents the time needed for dissolving 10 nm of oxide in the BOX layer 602 of the SOI wafer 600 using a standard dissolution method as explained with reference to FIG. 6, namely with an uncapped thick silicon layer 601 having a standard thickness $hs_i$ of about 200 nm, and using an oxygen-tight furnace at high temperatures.

In contrast, a second line 202 represents the time needed for dissolving 10 nm of oxide in the BOX layer 102 of the SOI wafer 100 using the inventive BOX dissolution method as explained with reference to FIG. 1, namely with a thin silicon layer 101 capped by the oxygen scavenging layer 104. In order to emphasize the particular advantage of the disclosure, the measurements were carried out for a thin silicon layer 101 having a thickness $hs_i$ of about 10 nm.

As can be taken from FIG. 2, for a given anneal temperature, the inventive method allows an about 20 times faster diffusion than the standard method, and for a given dissolution time, the inventive method allows carrying out the dissolution anneal at a temperature of about 100° C. cooler than the standard method. In other words, the inventive method is less sensitive to slip-line generation than the standard method.

In advantageous variants of the first embodiment, and as further detailed in the examples below, the oxygen scavenging layer 104 can contain a calculated amount of scavenging element. In other words, the oxygen scavenging layer 104 can be optimized to absorb a controlled amount of oxygen. In this case, the inventive BOX dissolution method is self-limited, as dissolution will stop when the oxygen scavenging layer 104 is saturated. In the example illustrated in FIG. 2, as represented by the second line 202, dissolution stops after dissolving 10 nm of oxide.

The self-limitation provides the further advantages that final uniformity of the SOI wafer 100 is controlled by the deposition technique used for depositing the oxygen scavenging layer 104 and is not sensitive to the temperature or gas flow variations in the furnace.

Furthermore, defining dissolution amounts by appropriately choosing the oxygen scavenging layer 104 allows wafer-by-wafer tailoring of the thickness of the BOX layer 102. As commented above, since the dissolution stops after a predefined and controlled amount, this variant of the inventive method even allows mixing different products in the same furnace batch. In other words, in a self-limited variant, a plurality of SOI wafers 100 having all a different thickness of their respective BOX layer 102 can be processed simultaneously.

Without being restricted thereto, a first detailed example of the inventive method will now be described within the framework of the first embodiment and with reference to FIGS. 1 and 2. In this detailed example, the starting SOI wafer 100 has a silicon layer 101 with a thickness $hs_i$ of about 10 nm, and a BOX layer 102 with a thickness $h_{BOX}$ of about 35 nm BOX on a standard carrier substrate 103.

An oxygen scavenging layer 104 of non-stoichiometric $HfO_2$, in other words $HfO_x$ with x<2, here $HfO_{1.5}$, is deposited on the surface of the silicon layer 101 up to a thickness $h_{scav}$ of about 17.5 nm. The exact thickness $h_{scav}$ of the oxygen scavenging layer 104 may depend on the chosen deposition technique. Any standard deposition technique may be used, provided that it can result in the deposition of about $2.3 \times 10^{16}$ atoms·cm² of Hf, in excess of the $HfO_2$ stoichiometry. For instance, the equivalent of about $2.3 \times 10^{16}$ atoms·cm² of Hf plus about $6.9 \times 10^{16}$ molecules·cm² of $HfO_2$ could be deposited.

The SOI wafer 100 with the oxygen scavenging layer 104 is then annealed in an oxygen-free atmosphere (oxygen-tight furnace) for 3 h at 1050° C., or 50 min at 1100° C., or 15 min at 1150° C. The anneal may then be pursued at the same temperature for another period of time, for instance 30 min, to ensure that the dissolution has been completed.

During this process, about $4.6 \times 10^{16}$ atoms·cm² of oxygen will diffuse from the BOX layer 102 to the oxygen scavenging layer 104 of HfO$_x$ until the oxygen scavenging layer 104 becomes a layer of HfO$_2$, thereby stopping the dissolution process. The dissolution process will have consumed 10 nm out of the initial thickness h$_{BOX}$ of about 35 nm of the initial BOX layer 102.

Following the anneal, the resulting top HfO$_2$ layer, that is the oxygen scavenging layer 104 modified by the anneal, can optionally be removed from the resulting annealed SOI wafer 100, and the exposed surface of the post-dissolution anneal silicon layer 101 can then be cleaned. The post-process SOI wafer 100 will have a post-process silicon layer 101 with a post-process thickness hs$_i$ of about 14 nm and a post-process BOX layer 102 with a post-process thickness h$_{BOX}$ of about 25 nm.

Figure 1:
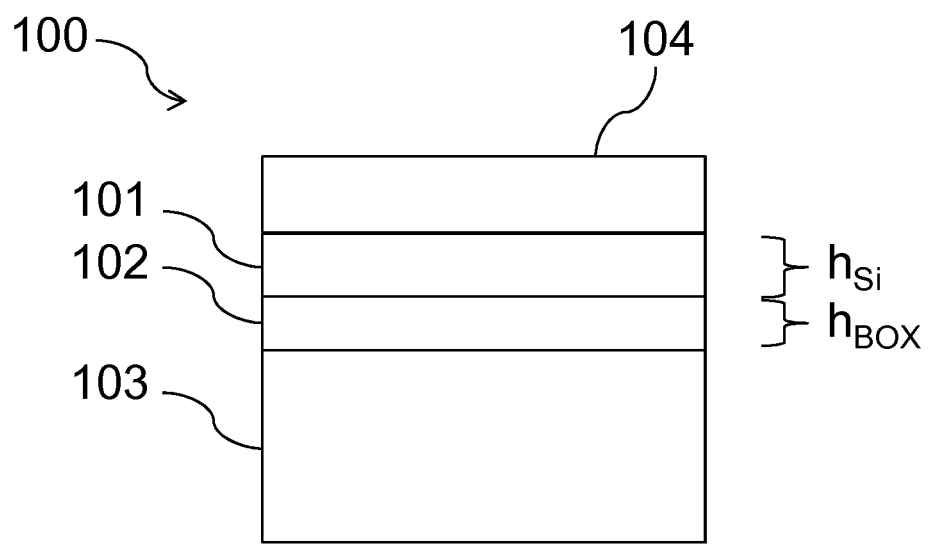
FIG. 1 schematically illustrates a silicon-on-insulator wafer with an oxygen scavenging layer, in a first exemplary embodiment of the present disclosure.
Figure 3:
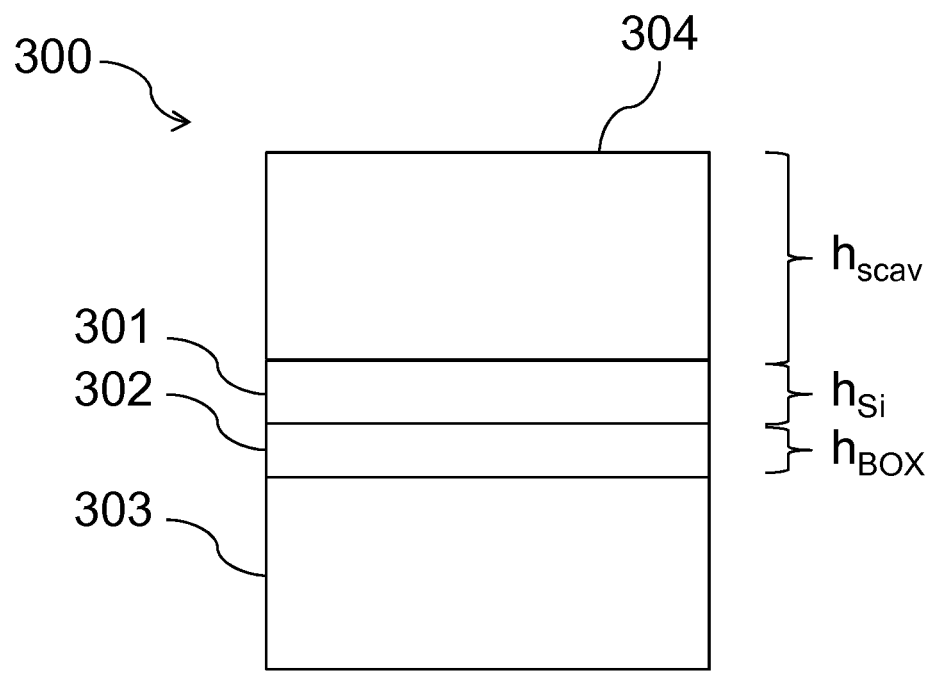
FIG. 3 schematically illustrates a silicon-on-insulator wafer with an oxygen scavenging layer, in a second exemplary embodiment of the present disclosure.
Figure 4:
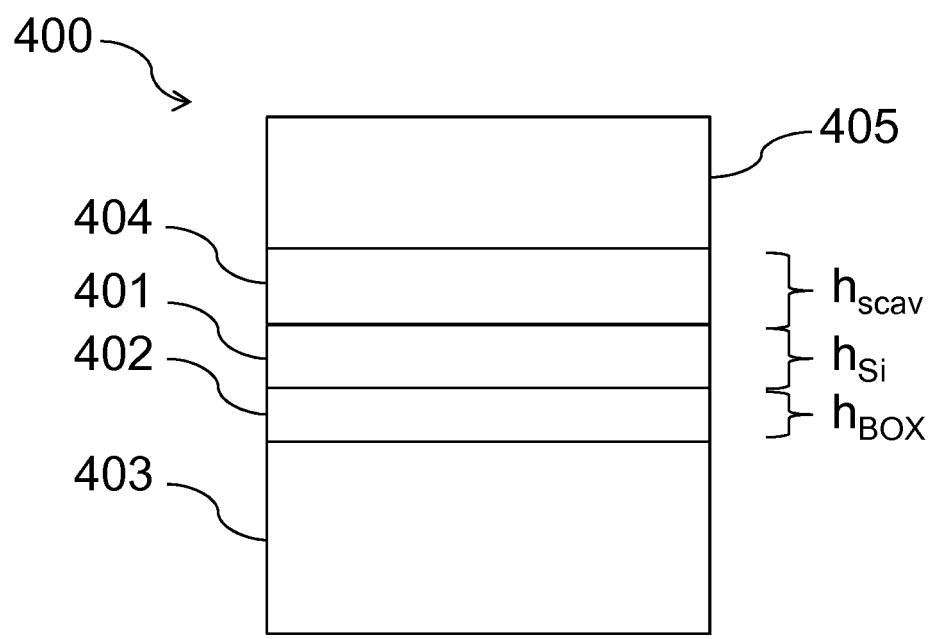
FIG. 4 schematically illustrates a silicon-on-insulator wafer with an oxygen scavenging layer and an optional oxygen diffusion barrier layer, in a third embodiment of the present disclosure.
Figure 5:
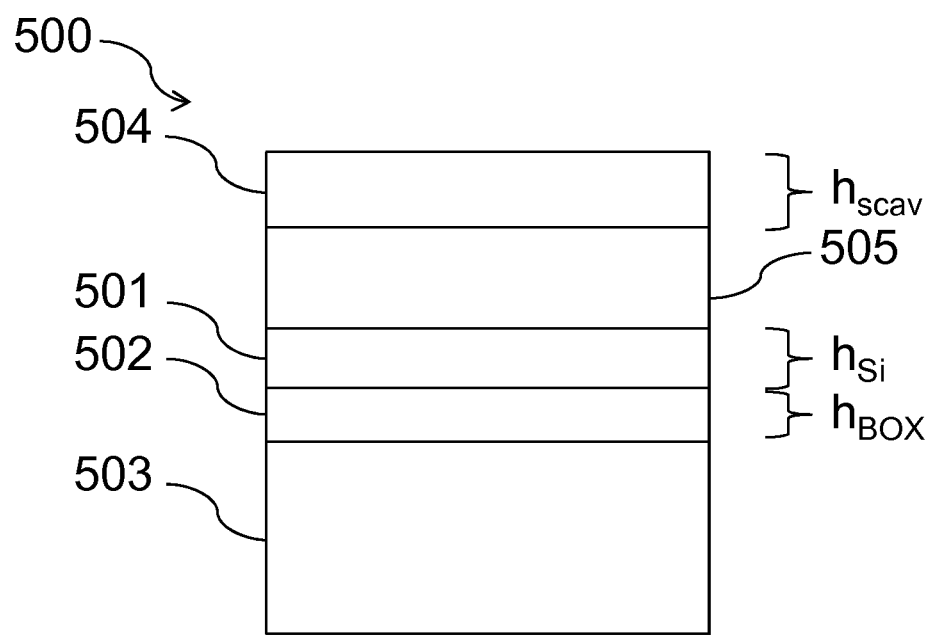
FIG. 5 schematically illustrates a silicon-on-insulator wafer with an oxygen scavenging layer and an optional barrier layer for preventing diffusion of the scavenging element, in a fourth embodiment of the present disclosure.

The advantages described above in relation to the first embodiment and with reference to FIGS. 1 and 2 are also applicable to the embodiments described hereafter with reference to FIGS. 3-5, which share most if not all the features of the first embodiment. Thus, the following description will focus on the aspects that vary from those described above. As will become evident, variants of the present disclosure can provide further advantages, which will be described hereafter, such as the possible use of a standard furnace.

A second exemplary embodiment of the disclosure will be described with reference to FIG. 3. Like in the first embodiment, in a first step, a SOI wafer 300 is provided. The SOI wafer 300 also comprises a silicon layer 301 attached to a carrier substrate 303 by a BOX layer 102. In a subsequent step, this SOI wafer 300 will undergo a BOX dissolution anneal.

In the second embodiment, before the BOX dissolution anneal, the top silicon layer 301 of the SOI wafer 300 is also capped by depositing thereon an oxygen scavenging layer 304. However, while the silicon layer 301 and the BOX layer 302 can have a respective thickness within the same range as described in the first embodiment, in contrast with the first embodiment and, in particular, with the first detailed example, the oxygen scavenging layer 304 of the second embodiment is thicker than the oxygen scavenging layer 104 of the first embodiment. In particular, the oxygen scavenging layer 304 may have a thickness h$_{scav}$ of at least about 200 nm.

While this thicker oxygen scavenging layer 304 still allows scavenging the oxygen from the BOX layer 302 as described in the first embodiment, in the second embodiment, the thickness h$_{scav}$ is sufficiently high for the oxygen scavenging layer 304 to even absorb oxygen from the ambient. In other words, in the second embodiment, residual oxygen can be present in the ambient, as long as it does not compete with the dissolution process.

As a consequence, in the second embodiment, there is no need for an oxygen-controlled ambient and, accordingly, an oxygen-tight furnace. In combination with the advantageous lower anneal temperatures reachable with the present disclosure, as explained with reference to FIG. 2, the second embodiment, therefore, allows using a standard furnace.

A third exemplary embodiment of the disclosure will now be described with reference to FIG. 4, which illustrates another advantageous variant that also allows using a standard furnace. Like in the previous embodiments, in a first step a SOI wafer 400 is provided. The SOI wafer 400 also comprises a silicon layer 401 attached to a carrier substrate 403 by a BOX layer 402. In a subsequent step, this SOI wafer 400 will undergo a BOX dissolution anneal.

Also like in the previous embodiments, in the third embodiment, before the BOX dissolution anneal, the top silicon layer 401 of the SOI wafer 400 is also capped by depositing thereon an oxygen scavenging layer 404. However, like in the first embodiment but in contrast with the second embodiment, the oxygen scavenging layer 404 is preferably tailored to a specifically desired amount of oxygen to be scavenged from the BOX layer 402, such that the variant of the third embodiment can also be self-limited in time. In other words, the oxygen scavenging layer 404 has a thickness h$_{scav}$ in the same range as the oxygen scavenging layer 104 of the first embodiment, well below that of the oxygen scavenging layer 304 of the second embodiment.

In addition, as illustrated in FIG. 4, after depositing the oxygen scavenging layer 404 and still before the BOX dissolution anneal, in the third embodiment, an optional oxygen diffusion barrier layer 405 is provided on top of the oxygen scavenging layer 404. As a consequence, residual oxygen can be present in the ambient but will not be scavenged by the oxygen scavenging layer 404.

As a consequence, with the optional oxygen diffusion barrier layer 405, in the third embodiment, there is even less need for an oxygen-controlled ambient than in the second embodiment. Thus, also in combination with the advantageous lower anneal temperatures reachable with the present disclosure, as explained with reference to FIG. 2, the third embodiment also advantageously allows using a standard furnace.

Without being restricted thereto, a second detailed example of the inventive method will now be described within the framework of the third embodiment and with reference to FIG. 4. In this detailed example, the starting SOI wafer 400 has a silicon layer 401 with a thickness hs$_i$ of about 10 nm, and a BOX layer 402 with a thickness h$_{BOX}$ of about 35 nm BOX on a standard carrier substrate 403.

Like in the first detailed example, an oxygen scavenging layer 404 of HfO$_{1.5}$ is deposited on the surface of the silicon layer 401 up to a thickness h$_{scav}$ of about 17.5 nm. As explained above, the exact thickness h$_{scav}$ of the oxygen scavenging layer 404 may also depend on the chosen deposition technique. Any standard deposition technique may be used, provided that it can result in the deposition of about $2.3 \times 10^{16}$ atoms·cm² of Hf, in excess of the HfO$_2$ stoichiometry. For instance, the equivalent of about $2.3 \times 10^{16}$ atoms·cm² of Hf plus about $6.9 \times 10^{16}$ molecules·cm² of HfO$_2$ could be deposited.

According to the variant described in the third embodiment, an optional layer of Si$_3$N$_4$ can be deposited on top of the SOI wafer 400, in particular, on the oxygen scavenging layer 404, up to a thickness of about 50 nm. This layer of Si$_3$N$_4$ forms the oxygen diffusion barrier layer 405 of the third embodiment.

The SOI wafer 400 with the oxygen scavenging layer 404 of HfO$_{1.5}$ and, on top thereon, the oxygen diffusion barrier layer 405 of Si$_3$N$_4$ is then annealed in a standard furnace for 3 h at 1050° C., or 50 min at 1100° C., or 15 min at 1150° C. In this case, the anneal may then be pursued at the same temperature for another period of time, for instance 15 min.

Like in the first detailed example, during this process, about $4.6 \times 10^{16}$ atoms·cm² of oxygen will diffuse from the BOX layer 402 to the oxygen scavenging layer 404 of HfO$_x$ until the oxygen scavenging layer 404 becomes a layer of HfO$_2$, thereby stopping the dissolution process. No residual oxygen present in the standard furnace will be scavenged by the oxygen scavenging layer 404 due to the presence of the oxygen diffusion barrier layer 405 of Si$_3$N$_4$. The dissolution process will have consumed 10 nm out of the initial thickness $h_{BOX}$ of about 35 nm of the initial BOX layer 402.

Following the anneal, the resulting top $Si_3N_4$ and $HfO_2$ layers, that is the oxygen diffusion barrier layer 405 and the oxygen scavenging layer 404 modified by the anneal, can optionally be removed from the resulting annealed SOI wafer 400, and the exposed surface of the post-dissolution anneal silicon layer 401 can then be cleaned. The post-process SOI wafer 400 will have a post-process silicon layer 401 with a post-process thickness $hs_i$ of about 14 nm and a post-process BOX layer 402 with a post-process thickness $h_{BOX}$ of about 25 nm.

A fourth exemplary embodiment of the disclosure will be described with reference to FIG. 5. Like in the previous embodiments, in a first step, a SOI wafer 500 is provided. The SOI wafer 500 also comprises a silicon layer 501 attached to a carrier substrate 503 by a BOX layer 502. In a subsequent step, this SOI wafer 500 will undergo a BOX dissolution anneal.

Also like in the previous embodiments, in the fourth embodiment, according to the present disclosure, before the BOX dissolution anneal, the top silicon layer 501 of the SOI wafer 500 is capped by depositing thereon an oxygen scavenging layer 504. However, prior to this step, and in any case before the BOX dissolution anneal, the fifth embodiment comprises a further step of providing an optional diffusion barrier layer 505 on top of the silicon layer 501 and on top of which the oxygen scavenging layer 504 will be deposited rather than being directly deposited on the silicon layer 501.

By appropriately choosing the material of the optional diffusion barrier layer 505, scavenging oxygen from the underlying BOX layer 502 remains possible, but diffusion of the oxygen scavenging element from the oxygen scavenging layer 504 into the silicon layer 501 can be prevented. For instance, when the oxygen scavenging layer 504 comprises a lanthanide metal, the optional diffusion barrier layer 505 can be a layer of La, and when the oxygen scavenging layer 504 comprises or $HfO_x$, like in some of the previous embodiments, the optional diffusion barrier layer 505 can be a layer of Hf. Thus, the optional diffusion barrier layer 505 can improves the control of the dissolution process and can be used to simplify the deposition of the oxygen scavenging layer 504.

In variants of the fourth embodiment, depending on the thickness $h_{scav}$ of the oxygen scavenging layer 504, an oxygen-tight furnace might be preferable, like in the first detailed example related to the first embodiment or variants thereof, or it might be possible to use a standard furnace, like in the second embodiment or variants thereof. In further variants of the fourth embodiment, using a standard furnace would also be possible if an optional oxygen diffusion barrier layer were provided, like the oxygen diffusion barrier layer 405 of the third embodiment or variants thereof.

Further combinations of the various embodiments described above are also possible and form additional embodiments and/or variants of the BOX dissolution method according to the present disclosure.

To summarize, by adding a capping oxygen scavenging layer on or over the silicon layer of a SOI wafer, the present disclosure and its many variants provide an improved BOX dissolution method compared to known BOX dissolution methods. In particular, the inventive method allows carrying out the BOX dissolution even for SOI wafers having a thin layer of silicon, in particular, as thin as about 10 nm. Advantageous variants of the inventive method even allow carrying out the BOX dissolution without the need of an oxygen-controlled ambient, in other words in a standard furnace. Advantageous variants even provide a self-limited dissolution, such that simultaneous BOX dissolutions can be carried out in parallel in the same furnace, for a plurality of SOI wafers having different layer thicknesses.

The invention claimed is:

1. A method of manufacturing a silicon-on-insulator wafer, comprising:
   providing a silicon-on-insulator wafer including:
      a silicon layer,
      a carrier substrate,
      a buried oxide layer between the silicon layer and the carrier substrate, and
      an oxygen scavenging layer on or over the silicon layer; and
   annealing the silicon-on-insulator wafer and at least partially dissolving the buried oxide layer.

2. The method of claim 1, wherein the silicon layer has a thickness ($h_{Si}$) of about 150 nm or less.

3. The method of claim 2, wherein the silicon layer has a thickness ($h_{Si}$) of about 50 nm or less.

4. The method of claim 3, wherein the silicon layer has a thickness ($h_{Si}$) of about 25 nm or less.

5. The method of claim 2, wherein the silicon layer is a strained layer.

6. The method of claim 5, wherein the oxygen scavenging layer has a thickness ($h_{scav}$) adapted for dissolving at least a predetermined thickness of the buried oxide layer to be dissolved.

7. The method of claim 6, wherein the oxygen scavenging layer comprises substoichiometric $HfO_x$, wherein x<2.

8. The method of claim 7, wherein the oxygen scavenging layer comprises a material chosen from among a lanthanide metal, a rare earth metal, a titanium rich (Ti-rich) titanium nitride (TiN), Group 2 elements, and Group 3 elements.

9. The method of claim 8, further comprising providing a diffusion barrier layer on top of the oxygen scavenging layer and/or between the oxygen scavenging layer and the silicon layer prior to annealing the silicon-on-insulator wafer and at least partially dissolving the buried oxide layer.

10. The method of claim 9, wherein the diffusion barrier layer is provided on top of the oxygen scavenging layer, and wherein the diffusion barrier layer is an oxygen diffusion barrier layer.

11. The method of claim 10, wherein when the diffusion barrier layer is provided directly on top of the oxygen scavenging layer, and wherein the diffusion barrier layer is a layer of a silicon nitride.

12. The method of claim 9, wherein the diffusion barrier layer is provided between the oxygen scavenging layer and the silicon layer, and wherein the diffusion barrier layer comprises a material having a composition preventing diffusion of an oxygen scavenging element of the oxygen scavenging layer into the silicon layer.

13. The method of claim 12, wherein the diffusion barrier layer comprises a layer of stoichiometric $HfO_2$.

14. The method of claim 1, wherein annealing the silicon-on-insulator wafer comprises annealing the silicon-on-insulator wafer in a standard furnace that is not oxygen-tight.

15. The method of claim 1, wherein providing the silicon-on-insulator wafer comprises transferring the silicon layer onto the carrier substrate using a layer transfer technique by ion implantation.

16. The method of claim 1, wherein the silicon layer is a strained layer.

17. The method of claim 1, wherein the oxygen scavenging layer has a thickness ($h_{scav}$) adapted for dissolving at least a predetermined thickness of the buried oxide layer to be dissolved.

18. The method of claim 1, wherein the oxygen scavenging layer comprises substoichiometric $HfO_x$, wherein x<2.

19. The method of claim 1, wherein the oxygen scavenging layer comprises a material chosen from among a lanthanide metal, a rare earth metal, a titanium rich (Ti-rich) titanium nitride (TiN), Group 2 elements, and Group 3 elements.

20. The method of claim 1, further comprising providing a diffusion barrier layer on top of the oxygen scavenging layer and/or between the oxygen scavenging layer and the silicon layer prior to annealing the silicon-on-insulator wafer and at least partially dissolving the buried oxide layer.

* * * * *